US009916998B2

(12) United States Patent
Sun et al.

(10) Patent No.: US 9,916,998 B2

(45) **Date of Patent: *Mar. 13, 2018**

(54) SUBSTRATE SUPPORT ASSEMBLY HAVING A PLASMA RESISTANT PROTECTIVE LAYER

(71) Applicant: Applied Materials, Inc., Santa Clara, CA (US)

(72) Inventors: Jennifer Y. Sun, Mountain View, CA (US); Senh Thach, Union City, CA (US); Biraja P. Kanungo, San Jose, CA (US); Vahid Firouzdor, San Mateo, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 431 days.

This patent is subject to a terminal disclaimer.

(21) Appl. No.: 14/086,799

(22) Filed: Nov. 21, 2013

(65) Prior Publication Data

US 2014/0154465 A1 Jun. 5, 2014

Related U.S. Application Data

(60) Provisional application No. 61/733,349, filed on Dec. 4, 2012, provisional application No. 61/791,669, filed on Mar. 15, 2013.

(51) Int. Cl.

*H01L 21/683* (2006.01)
*H01L 21/687* (2006.01)

(52) U.S. Cl.

CPC ...... *H01L 21/6831* (2013.01); *H01L 21/6875* (2013.01); *H01L 21/68757* (2013.01);

(Continued)

(58) Field of Classification Search

CPC .................................................. H01L 21/6831

See application file for complete search history.

(56) References Cited

U.S. PATENT DOCUMENTS

| | | | |
|---|---|---|---|
| 4,439,248 | A | 3/1984 | Herchenroeder et al. |
| 4,725,566 | A | 2/1988 | Pham Ngu et al. |

(Continued)

FOREIGN PATENT DOCUMENTS

| | | |
|---|---|---|
| DE | 200301654 | 6/2003 |
| DE | 10224137 A1 | 12/2003 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — William P Watkins, III

(74) *Attorney, Agent, or Firm* — Lowenstein Sandler LLP

(57) ABSTRACT

A substrate support assembly comprises a ceramic body and a thermally conductive base bonded to a lower surface of the ceramic body. The substrate support assembly further comprises a protective layer covering an upper surface of the ceramic body, wherein the protective layer comprises at least one of yttrium aluminum garnet (YAG) or a ceramic compound comprising $Y_4Al_2O_9$ and a solid-solution of $Y_2O_3$—$ZrO_2$.

11 Claims, 7 Drawing Sheets

700

START

Provide Ceramic Body 705

Apply Bulk Sintered Ceramic Article On Upper Surface of Ceramic Body, Bulk Sintered Article Comprising YAG or Ceramic Compound of $Y_4Al_2O_9$ And A Solid-Solution of $Y_2O_3$-$ZrO_2$ 710

Heat Ceramic Body And Bulk Sintered Ceramic Article To Form An Interface Layer 715

Bond Thermally Conductive Base To Lower Surface of Ceramic Body 720

Form Mesas On Upper Surface of Ceramic Body 725

Form Holes In Ceramic Body And Protective Layer 730

END

(52) U.S. Cl.
CPC .. *Y10T 156/1041* (2015.01); *Y10T 428/24322* (2015.01); *Y10T 428/24997* (2015.04)

(56) References Cited

U.S. PATENT DOCUMENTS 5,034,688 A 7/1991 Moulene et al.
5,108,025 A 4/1992 Kang et al.
5,113,472 A 5/1992 Gualtieri et al.
5,381,944 A 1/1995 Makowiecki et al.
5,548,470 A 8/1996 Husain et al.
5,631,803 A 5/1997 Cameron et al.
5,680,013 A 10/1997 Dornfest et al.
5,800,871 A 9/1998 Collins et al.
5,886,863 A 3/1999 Nagasaki et al.
5,903,428 A 5/1999 Grimard et al.
5,916,689 A 6/1999 Collins et al.
6,063,203 A 5/2000 Satoh
6,194,083 B1 2/2001 Yasuda et al.
6,245,202 B1 6/2001 Edamura et al.
6,361,645 B1 3/2002 Schoepp et al.
6,444,957 B1 9/2002 Kitagawa et al.
6,500,265 B1 12/2002 Shang et al.
6,506,254 B1 1/2003 Bosch et al.
6,508,884 B2 1/2003 Kuibira et al.
6,534,194 B2 3/2003 Weihs et al.
6,581,275 B2 6/2003 Narendrnath et al.
6,616,031 B2 9/2003 Wong et al.
6,641,697 B2 11/2003 Han et al.
6,682,820 B1* 1/2004 Pujari ................ C04B 35/5935 428/426
6,780,787 B2 8/2004 O'Donnell
6,805,952 B2 10/2004 Chang et al.
6,847,516 B2 1/2005 Kwon et al.
6,921,881 B2 7/2005 Ito et al.
6,933,254 B2 8/2005 Morita et al.
6,942,929 B2 9/2005 Han et al.
7,434,676 B2 10/2008 Brill et al.
7,441,688 B2 10/2008 Van Heerden et al.
7,517,617 B2 4/2009 Aschke et al.
7,586,734 B2 9/2009 Kamitani et al.
7,615,133 B2 11/2009 Tateno et al.
7,649,729 B2 1/2010 Buchberger, Jr. et al.
7,690,308 B2 4/2010 Nielson et al.
7,696,117 B2 4/2010 Sun et al.
7,718,007 B2 5/2010 Oohashi et al.
7,810,704 B2 10/2010 Duckham et al.
7,824,498 B2 11/2010 Parkhe et al.
7,964,517 B2 6/2011 Jaiswal
8,034,734 B2 10/2011 Sun et al.
8,075,729 B2 12/2011 Holland et al.
8,206,829 B2 6/2012 Sun et al.
8,390,980 B2 3/2013 Sansoni et al.
8,404,572 B2 3/2013 Chang et al.
8,829,397 B2 9/2014 Kano et al.
8,852,348 B2 10/2014 Parkhe et al.
8,941,969 B2 1/2015 Thach et al.
2002/0129904 A1 9/2002 Itabashi et al.
2002/0177001 A1 11/2002 Harada et al.
2003/0007308 A1 1/2003 Harada et al.
2003/0029563 A1 2/2003 Kaushal et al.
2003/0047802 A1 3/2003 Hiramatsu et al.
2003/0161088 A1 8/2003 Migita
2003/0170415 A1 9/2003 Hiramatsu et al.
2004/0002221 A1 1/2004 O'Donnell et al.
2004/0048461 A1 3/2004 Chen et al.
2004/0055709 A1 3/2004 Boyd, Jr. et al.
2004/0065259 A1 4/2004 Inazumachi et al.
2004/0117977 A1 6/2004 Hiramatsu et al.
2004/0187787 A1 9/2004 Dawson et al.
2004/0240142 A1 12/2004 Fujii et al.
2005/0016684 A1 1/2005 Sun et al.
2005/0037193 A1 2/2005 Sun et al.
2005/0041364 A1* 2/2005 Kellerman .......... H01L 21/6875 361/234
2005/0045106 A1 3/2005 Boyd, Jr. et al.
2005/0056218 A1 3/2005 Sun et al.
2005/0215073 A1 9/2005 Nakamura et al.
2005/0266682 A1 12/2005 Chen et al.
2006/0002053 A1 1/2006 Brown et al.
2006/0164785 A1 7/2006 Pellegrin
2007/0047170 A1 3/2007 Sun et al.
2007/0212567 A1 9/2007 Esaki et al.
2008/0016684 A1 1/2008 Olechnowicz et al.
2008/0029032 A1 2/2008 Sun et al.
2008/0174930 A1 7/2008 Hattori et al.
2008/0264564 A1* 10/2008 Sun .................. H01J 37/32467 156/345.1
2008/0264565 A1 10/2008 Sun et al.
2008/0266746 A1 10/2008 Handa et al.
2008/0268645 A1 10/2008 Kao et al.
2009/0034147 A1 2/2009 Narendrnath et al.
2009/0034148 A1 2/2009 Lubomirsky et al.
2009/0034149 A1 2/2009 Lubomirsky et al.
2009/0036292 A1 2/2009 Sun et al.
2009/0159588 A1 6/2009 Morioka et al.
2009/0214825 A1 8/2009 Sun et al.
2009/0284894 A1 11/2009 Cooke
2010/0053841 A1 3/2010 Rusinko, Jr. et al.
2010/0116788 A1 5/2010 Singh et al.
2010/0119843 A1 5/2010 Sun et al.
2010/0177454 A1 7/2010 Elliot et al.
2010/0314356 A1 12/2010 Nagayama et al.
2011/0049729 A1 3/2011 Naundorf et al.
2011/0149462 A1 6/2011 Kugimoto et al.
2011/0174441 A1 7/2011 Yamashita et al.
2012/0034469 A1 2/2012 Sun et al.
2012/0076574 A1 3/2012 Parkhe
2012/0104703 A1 5/2012 Sun et al.
2012/0141661 A1 6/2012 Cho et al.
2012/0299253 A1 11/2012 Kosakai et al.
2012/0307412 A1 12/2012 Boyd, Jr. et al.
2013/0019797 A1 1/2013 Tanaka et al.
2013/0026720 A1 1/2013 Hori et al.
2013/0224675 A1 8/2013 Park
2014/0159325 A1* 6/2014 Parkhe ............. H01L 21/67109 279/128
2014/0203526 A1 7/2014 Banda et al.

FOREIGN PATENT DOCUMENTS

JP H06216224 A 8/1994
JP 2000306986 A 11/2000
JP 2001308075 A 11/2001
JP 2006216224 A 8/2006
JP 2008016709 A 1/2008
WO 1999016122 4/1999
WO WO2001024581 4/2001
WO 03100843 A2 12/2003
WO WO2003100843 12/2003
WO WO2005027203 A2 3/2005

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.
Di Girolamo et al., "Microstructure and thermal properties of plasma-sprayed ceramic thermal barrier coatings," Energia, Ambiente e Innovazione, Published Jan. 2, 2013.
Bergant et al., "Porosity evaluation of flame-sprayed and heat-treated coatings using image analysis," Image Anal Stereol 2011;30:53-62, Published Jan. 27, 2011.
International Search Report & Written Opinion of the International Searching Authority dated Mar. 20, 2014, in International Application No. PCT/US2013/073192.
Haas et al., "Gas jet assisted vapor deposition of yttria stabilized zirconia," Department of Materials Science and Engineering, School of Engineering and Applied Science, published Feb. 27, 2009. University of Virginia, Charlottesville, Virginia 22903.

* cited by examiner

SUBSTRATE SUPPORT ASSEMBLY HAVING A PLASMA RESISTANT PROTECTIVE LAYER

RELATED APPLICATIONS

This patent application claims the benefit under 35 U.S.C. § 119(e) of U.S. Provisional Application No. 61/733,349, filed Dec. 4, 2012 and further claims the benefit under 35 U.S.C. § 119(e) of U.S. Provisional Application No. 61/791,669, filed Mar. 15, 2013.

TECHNICAL FIELD

Embodiments of the present invention relate, in general, to a substrate support assembly such as an electrostatic chuck that has a plasma resistant protective layer.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

SUMMARY

In one embodiment, a substrate support assembly comprises a ceramic body, a thermally conductive base bonded to a lower surface of the ceramic body, and a protective layer covering an upper surface of the ceramic body, wherein the protective layer is a yttrium aluminum garnet (YAG) or a ceramic compound comprising $Y_4Al_2O_9$ and a solid-solution of $Y_2O_3$—$ZrO_2$. In one embodiment, the protective layer is deposited on the upper surface of the ceramic body via ion assisted deposition (IAD) or plasma spraying. In another embodiment, the protective layer is a bulk sintered ceramic body that is diffusion bonded to the ceramic body via a heat treatment.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a substrate support assembly having a protective layer formed over a ceramic body of the substrate support assembly. The protective layer may provide plasma corrosion resistance for protection of the ceramic body. The protective layer may be yttrium aluminum garnet (YAG) or a ceramic compound that includes $Y_4Al_2O_9$ and a solid-solution of $Y_2O_3$—$ZrO_2$. The improved erosion resistance provided by the protective layer may improve the service life of the substrate support assembly, while reducing maintenance and manufacturing cost.

Note that embodiments are described herein with reference to substrate support assemblies such as electrostatic chucks (ESCs). However, it should be understood that embodiments may also apply to other structures that are exposed to plasma. For example, embodiments may apply to ceramic coated rings, walls, bases, gas distribution plates, shower heads, liners, liner kits, shields, plasma screens, flow equalizers, chamber walls, cooling base, etc. of a plasma etcher, a plasma cleaner, a plasma propulsion system, and so forth.

For embodiments of the present invention applying to any of the aforementioned chamber components, a protective layer may be a composite ceramic that includes $Y_4Al_2O_9$ and a solid-solution of $Y_2O_3$—$ZrO_2$. The protective layer may be applied over existing material (e.g., be a top coat), or may be a sole protecting layer. Though certain embodiments are discussed with regards to a ceramic compound that includes $Y_4Al_2O_9$ and a solid-solution of $Y_2O_3$—$ZrO_2$ (referred to herein as the composite ceramic), other plasma resistant ceramics may also be used. Such other plasma resistant ceramics may include yttria alumina garnet (YAG), yttria stabilized zirconia (YSZ) or various yttria based solid solutions.

Figure 1:
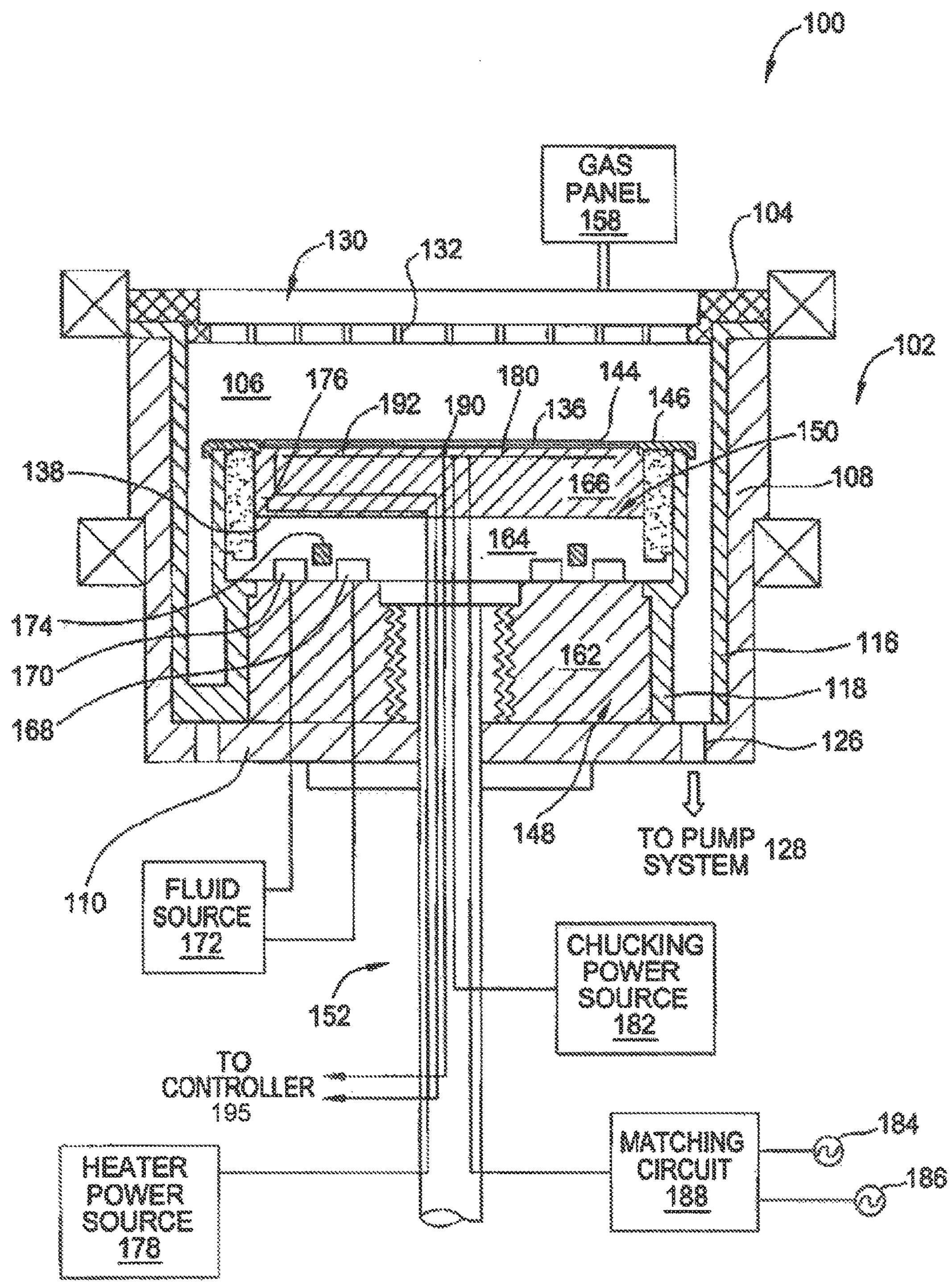
FIG. 1 depicts a sectional view of one embodiment of a processing chamber.

FIG. 1 is a sectional view of one embodiment of a semiconductor processing chamber 100 having a substrate support assembly 148 disposed therein. The substrate support assembly 148 has a protective layer 136 of a ceramic, which may be a composite ceramic or other ceramic. The composite ceramic is composed of a compound of $Y_4Al_2O_9$ (YAM) and a solid solution of $Y_2\text{-}xZr_xO_3$ ($Y_2O_3$—$ZrO_2$ solid solution). The protective layer 136 may be a sintered bulk ceramic article that was produced from a ceramic powder or a mixture of ceramic powders. Alternatively, the protective layer 136 may be a plasma sprayed or thermally sprayed layer that was produced by plasma spraying (or thermally spraying) a mixture of ceramic powders. Alternatively, the protective layer 136 may be an ion assisted deposition (IAD) coating that was deposited using a bulk composite ceramic target or other bulk ceramic target.

In one embodiment, the composite ceramic coating is composed of a compound $Y_4Al_2O_9$ (YAM) and a solid solution $Y_2\text{-}xZr_xO_3$ ($Y_2O_3$—$ZrO_2$ solid solution). In a further embodiment, the composite ceramic coating includes 62.93 mol % $Y_2O_3$, 23.23 mol % $ZrO_2$ and 13.94 mol % $Al_2O_3$. In another embodiment, the composite ceramic coating can include $Y_2O_3$ in a range of 50-75 mol %, $ZrO_2$ in a range of 10-30 mol % and $Al_2O_3$ in a range of 10-30 mol %. In other embodiments, other distributions may also be used for the composite ceramic coating. In one embodiment, the composite ceramic is a yttrium oxide containing solid solution that may be mixed with one or more of $ZrO_2$, $Al_2O_3$, or combination thereof.

In one embodiment the ceramic coating is yttrium aluminum garnet (YAG) composed of 35 mol % $Y_2O_3$, 65 mol % $Al_2O_3$. In another embodiment, the ceramic coating can be YAG composed of 30-40 mol % $Y_2O_3$ and 60-70 mol % $Al_2O_3$.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, bulk Yttrium oxide thereof to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166. An upper surface of the electrostatic puck 166 is covered by the protective layer 136. In one embodiment, the protective layer 136 is disposed on the upper surface of the electrostatic puck 166. In another embodiment, the protective layer 136 is disposed on the entire surface of the electrostatic chuck 150 including the outer and side periphery of the thermally conductive base 164 and the electrostatic puck 166. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the electrostatic puck 166 and/or the protective layer. The gas passages may be fluidly coupled to a source of a heat transfer (or backside) gas, such as He via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the electrostatic puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2:
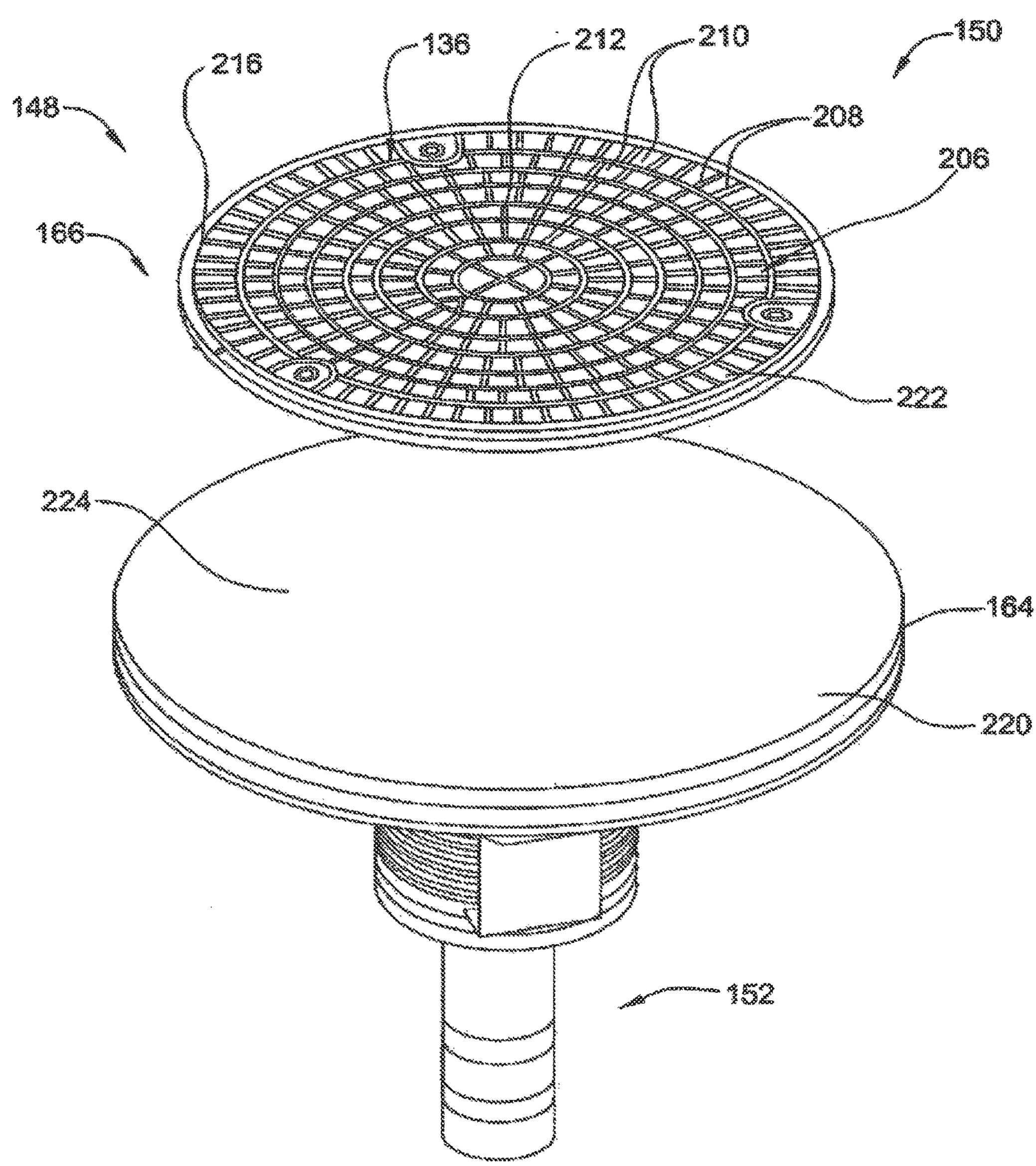
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck 150 and the pedestal 152. The electrostatic chuck 150 includes the electrostatic puck 166 and the thermally conductive base 164 attached to the electrostatic puck 166. The electrostatic puck 166 has a disc-like shape having an annular periphery 222 that may substantially match the shape and size of the substrate 144 positioned thereon. In one embodiment, the electrostatic puck 166 may be fabricated by a ceramic material. Suitable examples of the ceramic materials include aluminum oxide ($Al_2O_3$), aluminum nitride (AlN), titanium oxide (TiO), titanium nitride (TiN), silicon carbide (SiC) and the like.

The thermally conductive base 164 attached below the electrostatic puck 166 may have a disc-like main portion 224 and an annular flange 220 extending outwardly from a main portion 224 and positioned on the pedestal 152. The thermally conductive base 164 may be fabricated by a material having thermal properties substantially matching that of the overlying puck 166. In one embodiment, the thermally conductive base 164 may be fabricated by a metal, such as aluminum or stainless steel or other suitable materials. Alternatively, the thermally conductive base 164 may be fabricated by a composite of ceramic and metal material providing good strength and durability as well as heat transfer properties. The composite material may have a thermal expansion coefficient that is substantially matched to the overlying puck 166 to reduce thermal expansion mismatch. An upper surface 206 of the electrostatic puck 166 may be coated with the protective layer 136, and may have an outer ring 216, multiple mesas 206, 210 and channels 208, 212 between the mesas.

Figure 3:
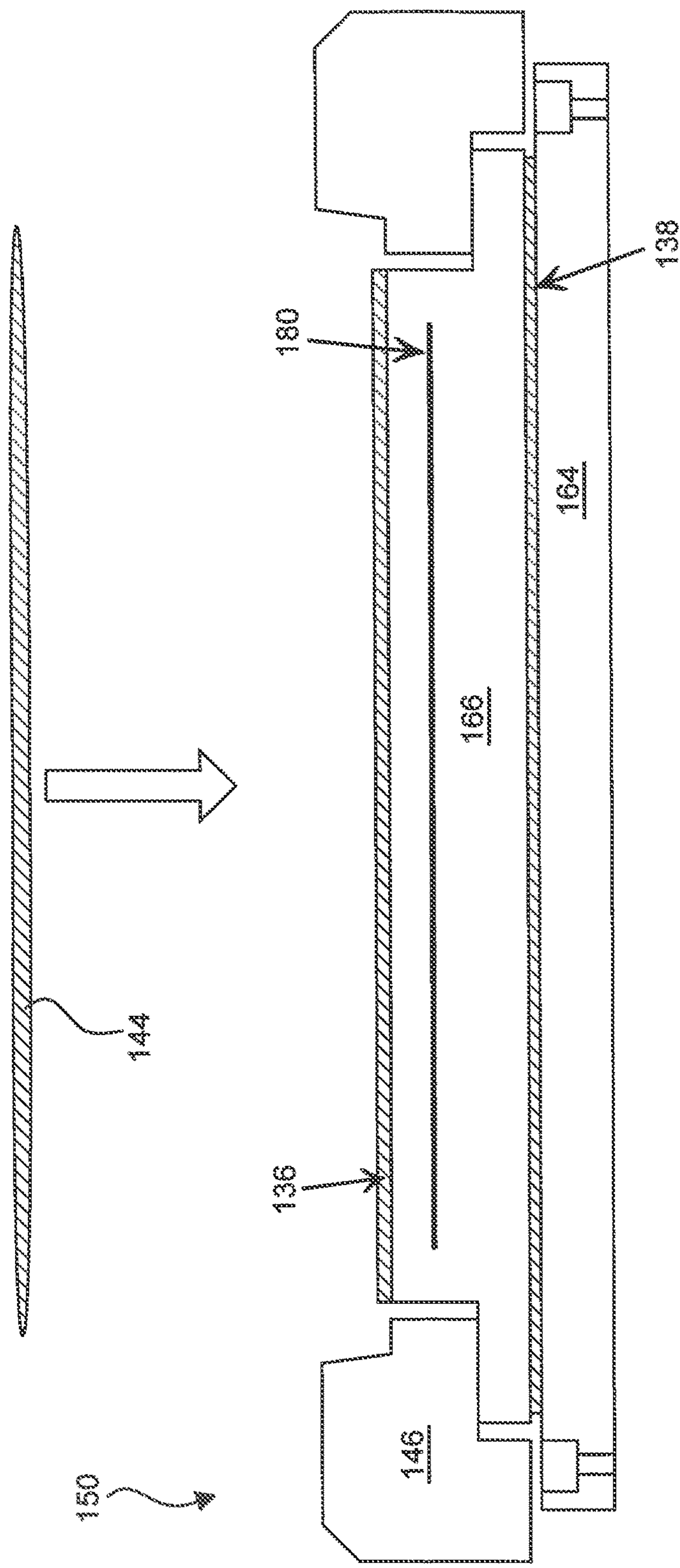
FIG. 3 depicts a side view of one embodiment of a substrate support assembly.

FIG. 3 illustrates a cross sectional side view of the electrostatic chuck 150. Referring to FIG. 3, the thermally conductive base 164 is coupled to the electrostatic puck 166 by a bonding material 138. The bonding material 138 facilitates thermal energy exchange between the electrostatic puck 166 and the thermally conductive base 164 and may reduce thermal expansion mismatch therebetween. In one exemplary embodiment, the bonding material 138 mechanically bonds the thermally conductive base 164 to the electrostatic puck 166. In another embodiment, the bonding material 138 may be a thermal conductive paste or tape having at least one of an acrylic based compound and silicone based compound. In yet another embodiment, the bonding material 138 may be a thermal conductive paste or tape having at least one of an acrylic based compound and silicone based compound with metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

A quartz ring 146, or other protective ring, surrounds and covers portions of the electrostatic chuck 150. The electrostatic puck 166 includes the clamping electrode 180. The protective layer 136 adheres to an upper surface of the electrostatic puck 166. The substrate 144 is lowered down over the electrostatic puck 166, and is held in place via electrostatic forces.

The protective layer 136 may be coated by traditional atmospheric plasma spray, low pressure plasma spray (LP PS), vacuum plasma spray (VPS), physical vapor deposition (PVD), chemical vapor deposition (CVD), ion assisted deposition (IAD), immersion coating, sputtering, thermal spraying, hot isostatic pressing, cold isostatic pressing, lamination, compression molding, casting, compacting, sintering or co-sintering techniques. In one embodiment, protective layer is plasma sprayed onto the electrostatic puck 166. In another embodiment, the protective layer 136 is deposited on the electrostatic puck 166 using ion assisted deposition (IAD). In still another embodiment, the protective layer 136 is a bulk sintered composite ceramic article that is diffusion bonded to an upper surface of the electrostatic puck 166.

Note that an optimal coating technique for applying the protective layer 136 may depend on the type of structure to be coated. For example, planar, flat surfaces such as the electrostatic puck 166, a shower head or a cooling base may be coated using any of the above techniques. Traditional PVD and IAD are two examples of coating techniques that are more successful on planar, flat surfaces. Parts with complex geometries such as a liner, shield, plasma screen, flow equalizer or chamber wall may be more successfully coated using plasma spray coating methods such as LP PS.

The composite ceramic and YAG both have a high hardness that resists wear (due to relative motion because of coefficient of thermal expansion mismatch between the substrate & the electrostatic puck) during plasma processing of the substrate or wafer. In one embodiment, the composite ceramic provides a Vickers hardness (5 Kgf) between about 5 GigaPascals (GPa) and about 20 GPa. In one embodiment, the composite ceramic is a bulk sintered ceramic that provides a Vickers hardness of about 9-10 GPa. In another embodiment, the bulk sintered ceramic provides a Vickers hardness of 14-16 GPa. Additionally, the composite ceramic may be a bulk sintered ceramic having a density of around 4.90 g/cm$^3$, a flexural strength of about 215 MPa, a fracture toughness of about 1.6 MegaPascals·square root of meters (MPa·m$^{1/2}$), a Youngs Modulus of about 190 GPa, a thermal expansion of about $8.5\times10^{-6}$/K (20~900° C.), a thermal conductivity of about 3.5 Watts per milliKelvin (W/mK), a dielectric constant of about 15.5 (measured at 20° C. 13.56 MHz), a dielectric loss tangent of less than 20×10−4 (20° C. 13.56 MHz), and a volume resistivity of greater than $10^{15}$ ohm centimeters (Ω·cm) at room temperature in one embodiment.

In one embodiment, bulk sintered YAG provides a Vickers hardness (5 Kgf) between about 10 GPa and about 20 GPa (with a hardness of 15 GPa in one embodiment). Additionally, the bulk sintered YAG may have a density of around 4.55 grams per centimeter cubed (g/cm$^3$), a flexural strength of about 280 MPa, a fracture toughness of about 2.0 MPa·m$^{1/2}$, a Youngs Modulus of about 282 GPa, a thermal expansion of about $8.2\times10^{-6}$/K (20~900° C.), a thermal conductivity of about 12.9 W/mK, and a volume resistivity of greater than $10^{14}$ Ω·cm at room temperature in one embodiment.

Coating properties may be similar to bulk for both the composite ceramic and YAG, with some coating properties being lower than those of bulk properties. In one embodiment, IAD coating hardness is about 4 GPa for the composite ceramic. Additionally, the IAD coated composite ceramic may have a high density, with a very low porosity of around 0.1-1.0%. The IAD coated composite ceramic may also have a breakdown voltage of about 2500 V/mil, a volume resistivity of about $4.1\times10^{16}$ Ω·cm, a dielectric constant of about 9.83, a loss tangent of about $4\times10^{-4}$, and a thermal conductivity of about 20.6 W/mK.

In one embodiment, IAD coating hardness is about 6 GigaPascals (GPa) for YAG. Additionally, the IAD coated YAG may have a high density, with a very low porosity of around 0.1-1.0%. The IAD coated YAG may also have a breakdown voltage of about 6800 V/mil, a volume resistivity of about $11.3\times10^{16}$ Ω·cm, a dielectric constant of about 9.76, a loss tangent of about $4\times10^{-4}$, and a thermal conductivity of about 20.1 W/mK.

In one embodiment, the plasma spray coated ceramic composite has a Vickers hardness (5 Kgf) of about 4.3 GPa. Additionally, the plasma sprayed composite ceramic may have a porosity of around 1.5-5% (with a porosity of 2.5% in one embodiment), a thermal expansion of about $8\times10^{-6}$/K (20~900° C.), a thermal conductivity of about 18.2 W/mK, a volume resistivity of around $10^{15}$ Ω·cm at room temperature, a breakdown voltage of about 1050 V/mil, and a loss tangent of about $16.5\times10^{-4}$ in one embodiment.

In one embodiment, the plasma sprayed YAG coating has a Vickers hardness (5 Kgf) of about 4.6 GPa. Additionally, the plasma sprayed YAG coating may have a porosity of around 2.5-4% (with a porosity of 3.5% in one embodiment), a thermal expansion of about $7.7\times10^{-6}$/K (20~900° C.), a thermal conductivity of about 19.6 W/mK, a volume resistivity of around $7\times10^{14}$ Ω·cm at room temperature, a breakdown voltage of about 1190 V/mil, and a loss tangent of about $3\times10^{-4}$ in one embodiment.

Figure 4A:
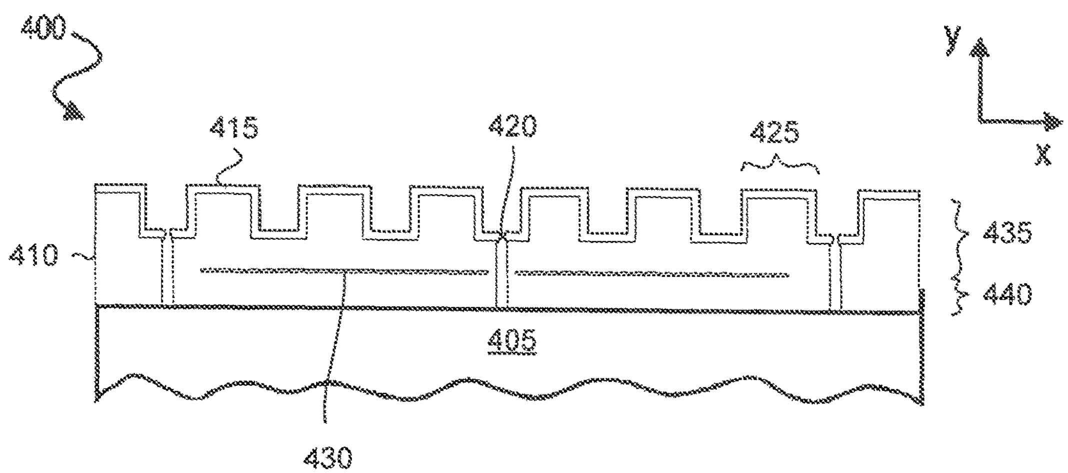
FIG. 4A depicts an exploded side view of one embodiment of a substrate support.

FIG. 4A illustrates a cross sectional side view of one embodiment of an electrostatic chuck 400. The electrostatic chuck 400 has a ceramic body 410 known as an electrostatic puck. The ceramic body 410 includes an electrode 430 embedded therein. In one embodiment, an upper portion 435 of the ceramic body that lies above the electrode 430 has a thickness of greater than 200 micron (e.g., 5 mil in one embodiment). The thickness of upper portion of the ceramic body 410 may be selected to provide desired dielectric properties such as a specific breakdown voltage. A lower portion 440 of the ceramic body that lies below the electrode 430 may have a thickness of up to about 5 mm. In one embodiment, the entire ceramic body has a thickness of about 5 mm. A lower surface of the ceramic body 410 is bonded to a thermally conductive base 405 (e.g., a metal base). Multiple mesas 425 or dimples are formed on an upper surface of the ceramic body 410. The mesas may be around 10-15 micron tall and about 200 micron in diameter in some embodiments. Additionally, multiple holes 420 are drilled through the ceramic body 410. In one embodiment, the holes 420 have a diameter of about 4-7 mil. In one embodiment, the holes are formed by laser drilling. The holes 420 may deliver a thermally conductive gas such as helium to valleys or conduits between the mesas. The helium (or other thermally conductive gas) may facilitate heat transfer between a substrate and the ceramic body 410.

A thin protective layer 415 having a thickness of less than about 20 microns is deposited on the upper surface of the ceramic body 410. In one embodiment, the protective layer has a thickness of about 3-5 microns. Due to the thinness of the protective layer 415, the protective layer 415 does not plug any of the holes 420. Additionally, the protective layer 415 maintains a relative shape of the upper surface of the ceramic body 410 (e.g., telegraphing the shapes of the mesas and valleys between the mesas). Note that in an alternative embodiment the holes 420 may be drilled (e.g., via laser drilling) after forming the protective layer 415.

The protective layer 415 may be deposited by performing ion beam assisted deposition (IAD). Alternatively, other types of energetic particles may be used to assist deposition, including neutron atoms, radicals, and nano-sized particles which come from particle generation sources, such as the plasma, reactive gases or from the material source that provide the deposition materials. For IAD, a material source provides a flux of deposition materials, while an energetic ion source provides a flux of energetic ions, both of which impinge upon the ceramic body 410 throughout the IAD process. In one embodiment, the material source (target body) used to provide the deposition materials is a bulk sintered ceramic composite body. In another embodiment, the target material is a pre-melt of the composite ceramic. In another embodiment, the target material is bulk sintered YAG. IAD may utilize one or more plasmas or beams to provide the material and energetic ion sources. In one embodiment, the energetic ions include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the protective layer 415. Exemplary IAD methods include deposition processes which incorporate ion bombardment, such as the evaporation (e.g., activated reactive evaporation (ARE)) and sputtering in the presence of ion bombardment. Any of the IAD methods may be performed in the presence of a reactive gas species, such as $O_2$, $N_2$, halogens, etc.

The IAD deposited protective layer 415 may have a relatively low film stress (e.g., as compared to a film stress caused by plasma spraying or sputtering). The relatively low film stress may cause the lower surface of the ceramic body to be very flat, with a curvature of less than about 50 microns over the entire ceramic body (which may be about 12 inches in diameter). In one embodiment, the curvature is less than about 20 microns. The IAD deposited protective layer may have a porosity that is less than 1%, and less than about 0.1% in some embodiments. Therefore, the IAD deposited protective layer is a dense structure, which can have performance benefits for application on an electrostatic chuck. For example, the IAD deposited protective layer 415 can have a dielectric breakdown voltage of greater than 1000 V/mil, and greater than 1500 V/mil in some embodiments. Additionally, the IAD deposited protective layer 415 may be deposited without first roughening the upper surface of the ceramic body 410. Since roughening the ceramic body may reduce a breakdown voltage of the ceramic body 410, the ability to apply the protective coating 415 without first roughening the ceramic body 410 may be beneficial. The electrostatic chuck 400 can be used both for Johnson-Rahbek electrostatic chucking applications and Columbic electrostatic chucking applications.

Figure 4B:
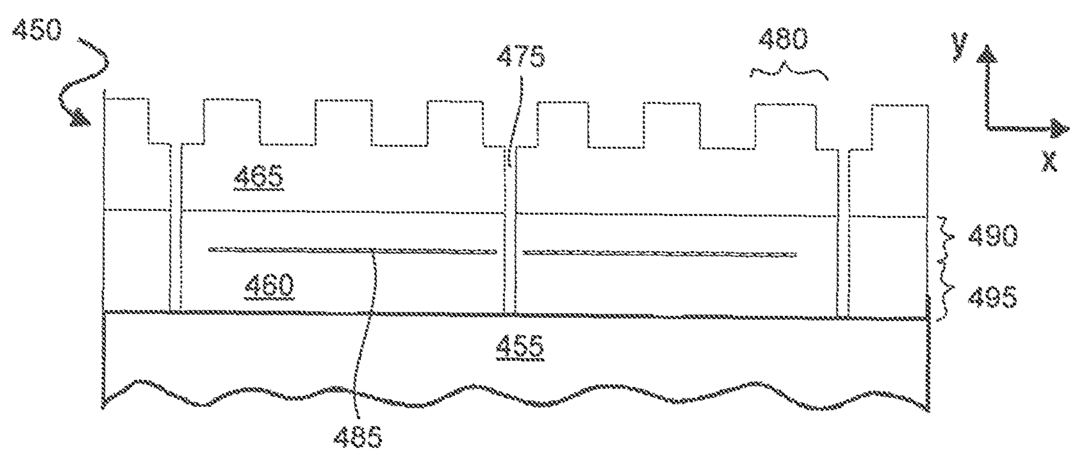
FIG. 4B depicts an exploded side view of another embodiment of a substrate support.

FIG. 4B illustrates a cross sectional side view of one embodiment of an electrostatic chuck 450. The electrostatic chuck 450 has a ceramic body 460 known as an electrostatic puck. In one embodiment, the ceramic body 460 includes an electrode 485, an upper portion 490 above the electrode 485 and a lower portion 495 below the electrode. The upper portion 490 may have a thickness of greater than 200 micron (e.g., 5 mil in one embodiment). In a further embodiment, the ceramic body 460 has a thickness of between about 200 micron and 500 micron. A lower surface of the ceramic body 460 is bonded to a thermally conductive base 455 (e.g., a metal base).

An upper surface of the ceramic body 460 is bonded to a protective layer 465. In one embodiment, the protective layer is a plasma sprayed composite ceramic. In another embodiment, the protective layer is plasma sprayed YAG. In either embodiment, an upper surface of the ceramic body 460 may be roughened prior to plasma spraying the protective coating 465 onto it. The roughening may be performed, for example, by bead blasting the ceramic body 460. Roughening the upper surface of the ceramic body provides anchor points to create a mechanical bond between the plasma sprayed protective layer 465 and the ceramic body 460 for better adhesion.

The protective layer 465 may have an as sprayed thickness of up to about 250 micron or thicker, and may be ground down to a final thickness of approximately 50 microns. Alternatively, the protective layer may be plasma sprayed to a final thickness. The plasma sprayed protective layer 465 may have a porosity of about 2-4%. In one embodiment, a combined thickness of the ceramic body 460 over the electrode and the protective layer 465 is sufficient to provide a total breakdown voltage of >2500V. The ceramic body 460 may be, for example, alumina, which has a breakdown voltage of about 15 Volts/micron (V/μm). The ceramic composite plasma sprayed protective layer 465 may have a breakdown voltage of about 30 V/μm (or about 750 V/mil) in one embodiment. Accordingly, the ceramic body 460 may be about 250 microns thick and the protective layer may be about 50 microns thick to have a breakdown voltage of about 5250 V, for example.

In another embodiment, the protective layer 465 is a bulk sintered composite ceramic article or bulk sintered YAG article that is placed on the upper surface of the ceramic body 460. The protective layer 465 may be provided, for example, as a thin ceramic wafer having a thickness of approximately 200 micron. A high temperature treatment is then performed to promote interdiffusion between the protective layer 465 and the ceramic body 460. The thermal treatment may be a heat treatment at up to about 1400-1500 degrees C. for a duration of up to about 24 hours (e.g., 3-6 hours in one embodiment). This may cause diffusion bonding between the protective layer 465 and the ceramic body 460. If the ceramic body is $Al_2O_3$, and the protective layer is composed of a compound $Y_4Al_2O_9$ (YAM) and a solid solution $Y_2$-$xZr_xO_3$ ($Y_2O_3ZrO_2$ solid solution), then a $Y_3Al_5O_{12}$ (YAG) interface layer will be formed. Notably, the transition layer may be a non-reactive and non-porous layer. Accordingly, during subsequent processing using a heat treated ceramic article, process gases may penetrate the ceramic coating, but may not penetrate the transition layer. Thus, the transition layer may prevent the process gasses from reacting with the ceramic substrate. The strong adhesion caused by the diffusion bonding allows the protective layer 465 to adhere to the ceramic body securely and prevents the protective layer 465 from cracking, peeling off, or stripping off during plasma processing. After the heat treatment, the protective layer may be ground down to a final thickness. The final thickness may be about 200 micron in one embodiment.

After the protective layer 465 is formed (and ground to a final thickness in some embodiments), mesas 480 are formed on an upper surface of the protective layer 465. The mesas may be formed, for example, by bead blasting or salt blasting the surface of the protective layer 465. After the protective layer 465 is formed, holes 475 may also be drilled in the protective layer 365 and the underlying ceramic body 460. The embodiments described with reference to FIG. 4B may be used for Columbic electrostatic chucking applications.

Figure 5:
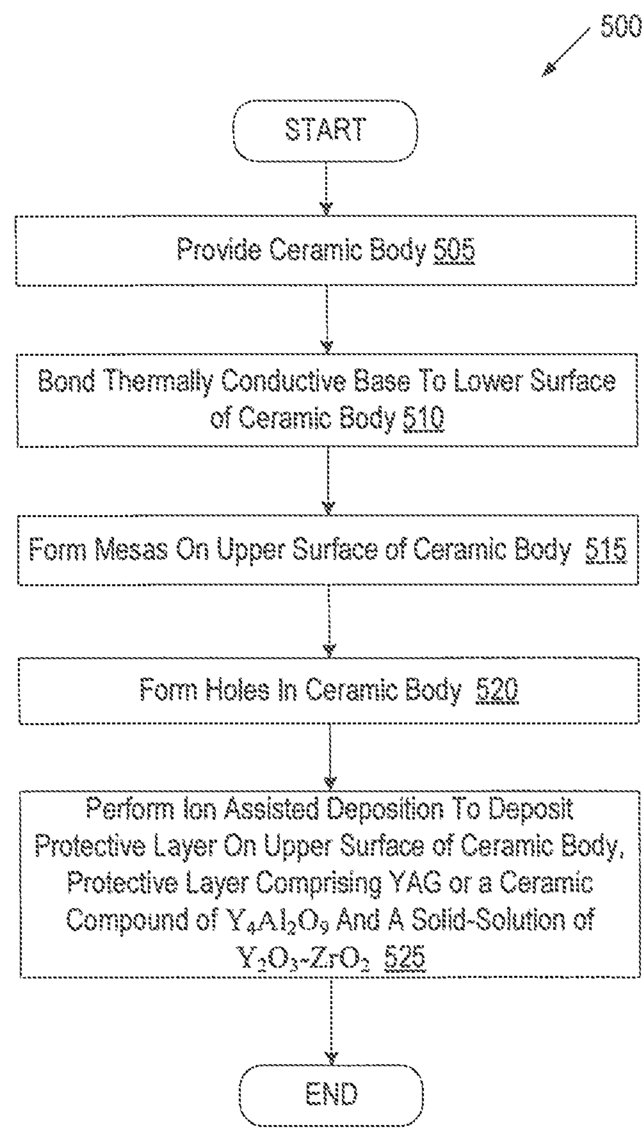
FIG. 5 illustrates one embodiment of a process for forming a protective layer over a ceramic body of a substrate support surface.

FIG. 5 illustrates one embodiment of a process 500 for forming a protective layer over a ceramic body of a substrate support surface. At block 505 of process 500, a ceramic body is provided. The ceramic body may be a metalized ceramic puck for an electrostatic chuck. The ceramic body may contain heating elements, an electrode, cooling channels, and/or other features. At block 510, a lower surface of the ceramic body is bonded to a thermally conductive base.

At block 515, mesas are formed on an upper surface of the ceramic body. At block 520, holes are formed in the ceramic body (e.g., by laser drilling). At block 525, IAD is performed to deposit a protective layer on the ceramic body. The protective layer may comprise a composite ceramic as previously described in embodiments or YAG. In an alternative embodiment, the ceramic body may be bonded to the base after the mesas are formed, after the holes are formed or after the protective layer is deposited.

Figure 6:
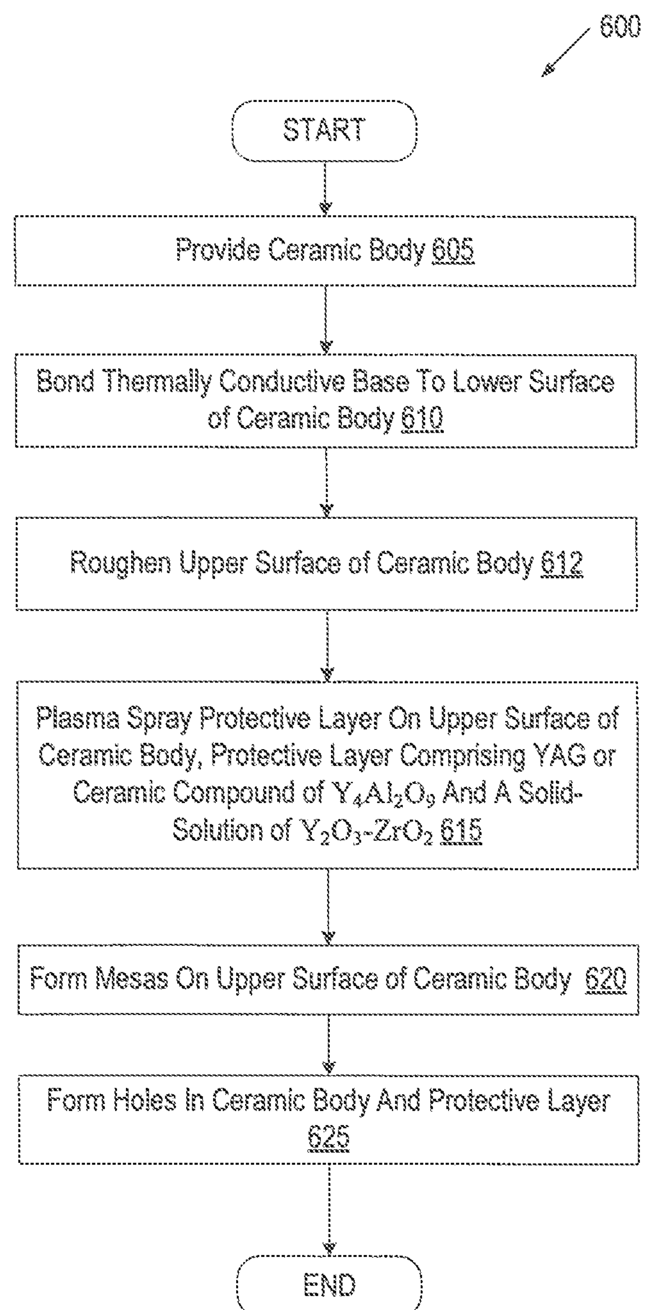
FIG. 6 illustrates another embodiment of a process for forming a protective layer over a ceramic body of a substrate support surface.

FIG. 6 illustrates another embodiment of a process for forming a protective layer over a ceramic body of a substrate support surface. At block 605 of process 600, a ceramic body is provided. At block 610, a lower surface of the ceramic body is bonded to a thermally conductive base. At block 612, an upper surface of the ceramic body is roughened (e.g., via bead blasting or grinding).

At block 615, a protective layer is plasma sprayed (or thermally sprayed) on the roughened upper surface of the ceramic body. The protective layer may comprise a composite ceramic as previously described in embodiments or YAG. At block 620, mesas are formed on an upper surface of the ceramic body. At block 625, holes are formed in the ceramic body (e.g., by laser drilling). In an alternative embodiment, the ceramic body may be bonded to the base after the mesas are formed, after the holes are formed or after the protective layer is deposited.

Figure 7:
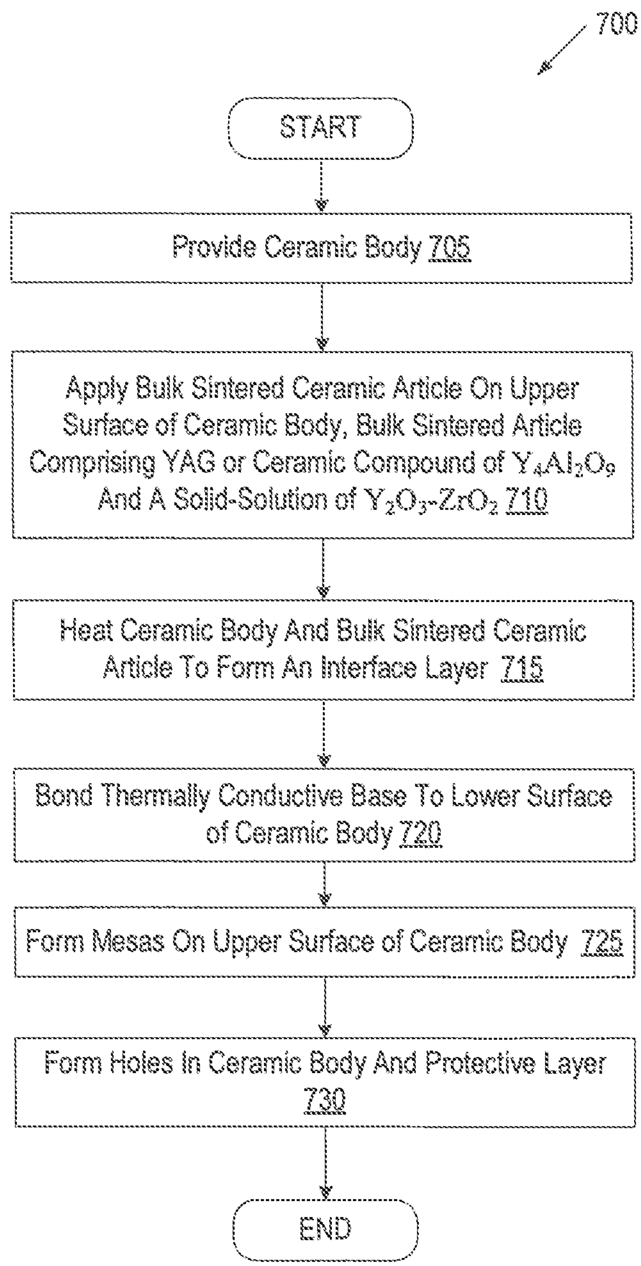
FIG. 7 illustrates yet another embodiment of a process for forming a protective layer over a ceramic body of a substrate support surface.

FIG. 7 illustrates yet another embodiment of a process for forming a protective layer over a ceramic body of a substrate support surface. At block 705 of process 700, a ceramic body is provided. At block 710, a bulk sintered ceramic article is applied to an upper surface of the ceramic body. The bulk sintered ceramic article may act as a protective layer for the ceramic body. The bulk sintered ceramic article may be a ceramic composite as previously described in embodiments or YAG. At block 715, the ceramic body and bulk sintered ceramic article are heated to a temperature of about 1400-1500 degrees C. (co-fired) to form an interface layer and cause diffusion bonding. At block 725, mesas are formed on an upper surface of the ceramic body by bead blasting. At block 730, holes are formed in the ceramic body (e.g., by laser drilling). In an alternative embodiment, the ceramic body may be bonded to the base before the mesas are formed, before the holes are formed or before the protective layer is bonded to the ceramic body.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A substrate support assembly comprising:

a ceramic body;

a thermally conductive base bonded to a lower surface of the ceramic body; and a bulk sintered ceramic wafer bonded to an upper surface of the ceramic body by a diffusion bond, wherein the bulk sintered ceramic wafer comprises a ceramic compound comprising $Y_4Al_2O_9$ and a solid-solution of $Y_2O_3$—$ZrO_2$, wherein the bulk sintered ceramic wafer has a hardness between about 14 GPa and about 16 GPa, and wherein the bulk sintered ceramic wafer comprises a plurality of mesas formed on a surface of the bulk sintered ceramic wafer, and wherein the ceramic body and the bulk sintered ceramic wafer each comprise a plurality of through holes that penetrate the bulk sintered ceramic wafer and the ceramic body.

2. The substrate support assembly of claim 1, wherein the ceramic body comprises $Al_2O_3$, the diffusion bond comprises an interface layer comprising $Y_3Al_5O_{12}$ (YAG), and the ceramic body is a flat electrostatic puck.

3. A method comprising:

applying a bulk sintered ceramic wafer to an upper surface of a ceramic body, the bulk sintered ceramic wafer comprising a ceramic compound of $Y_4Al_2O_9$ and a solid-solution of $Y_2O_3$—$ZrO_2$, wherein the bulk sintered ceramic wafer acts as a protective layer for the ceramic body and has a hardness between about 14 GPa and about 16 GPa;

heating the ceramic body and the bulk sintered ceramic wafer to form a diffusion bond between the ceramic body and the bulk sintered ceramic wafer, the diffusion bond comprising an interface layer between the upper surface of the ceramic body and the bulk sintered ceramic wafer, wherein the interface layer comprises first elements from the bulk sintered ceramic wafer that have reacted with second elements from the ceramic body to cause the diffusion bond;

drilling a plurality of through holes that penetrate the bulk sintered ceramic wafer and the ceramic body;

forming a plurality of mesas on a surface of the bulk sintered ceramic wafer; and bonding a thermally conductive base to a lower surface of the ceramic body.

4. The method of claim 3, wherein the ceramic body comprises $Al_2O_3$, the interface layer comprises $Y_3Al_5O_{12}$ (YAG), and the ceramic body is a flat electrostatic puck.

5. The substrate support assembly of claim 1, wherein the ceramic compound comprises from 50 to 75 mol % of $Y_2O_3$, from 10 to 30 mol % $ZrO_2$, and from 10 to 30% $Al_2O_3$.

6. The substrate support assembly of claim 1, wherein the bulk sintered ceramic wafer has a density of around 4.90 $g/cm^3$.

7. The substrate support assembly of claim 1, wherein the interface layer is non-reactive and non-porous.

8. The substrate support assembly of claim 1, wherein the bulk sintered ceramic wafer has a thickness of about 200 micrometers.

9. The substrate support assembly of claim 1, wherein the plurality of mesas formed on a surface of the bulk sintered ceramic wafer are about 10 to 15 micrometers tall and about 200 micrometers in diameter.

10. The substrate support assembly of claim 1, wherein the plurality of through holes that penetrate the bulk sintered ceramic wafer and the ceramic body have a diameter of about 4 to 7 millimeters.

11. The substrate support assembly of claim 1, wherein the ceramic compound comprises 62.93 mol % of $Y_2O_3$, 23.23 mol % $ZrO_2$, and 13.94 mol % $Al_2O_3$.

* * * * *